United States Patent
Chen et al.

(10) Patent No.: US 11,400,605 B2
(45) Date of Patent: Aug. 2, 2022

(54) ROTATABLE CUSHIONING PICK-AND-PLACE DEVICE

(71) Applicant: Chroma Ate Inc., Taoyuan (TW)

(72) Inventors: Chien-Ming Chen, Taoyuan (TW); Meng-Kung Lu, Taoyuan (TW); Ming-Yuan Huang, Taoyuan (TW)

(73) Assignee: CHROMA ATE INC., Taoyuan (TW)

( * ) Notice: Subject to any disclaimer, the term of this patent is extended or adjusted under 35 U.S.C. 154(b) by 106 days.

(21) Appl. No.: 17/063,752

(22) Filed: Oct. 6, 2020

(65) Prior Publication Data

US 2021/0197405 A1 Jul. 1, 2021

(30) Foreign Application Priority Data

Dec. 27, 2019 (TW) .................................. 108148012

(51) Int. Cl.
*B25J 17/02* (2006.01)
*B25J 15/06* (2006.01)
*B25J 9/10* (2006.01)

(52) U.S. Cl.
CPC ......... *B25J 17/0225* (2013.01); *B25J 9/1005* (2013.01); *B25J 9/108* (2013.01); *B25J 15/0616* (2013.01)

(58) Field of Classification Search
CPC ...... B25J 9/1005; B25J 9/108; B25J 15/0616; B25J 17/0225; B25J 19/0091; B65G 47/912; B65G 47/914; B65G 2207/28; H05K 13/0409
USPC ...................................................... 414/752.1
See application file for complete search history.

(56) References Cited

U.S. PATENT DOCUMENTS

| | | | | |
|---|---|---|---|---|
| 4,599,037 A * | 7/1986 | Ross, Jr | ............... | B25J 15/0616 414/753.1 |
| 5,285,946 A * | 2/1994 | Tomigashi | ......... | H05K 13/0409 228/9 |
| 5,707,093 A * | 1/1998 | Nagai | .................... | B65G 47/91 294/183 |
| 6,364,387 B1 * | 4/2002 | Bolotin | .............. | H05K 13/0413 414/737 |
| 6,851,914 B2 * | 2/2005 | Hirata | ................ | H05K 13/0409 414/752.1 |
| 8,704,111 B2 * | 4/2014 | Tanaka | ................. | B25J 15/0616 177/245 |
| 10,440,869 B2 * | 10/2019 | Kawaguchi | ........ | H05K 13/0409 |

* cited by examiner

*Primary Examiner* — Dean J Kramer
(74) *Attorney, Agent, or Firm* — McClure, Qualey & Rodack, LLP

(57) ABSTRACT

A rotatable cushioning pick-and-place device primarily comprises a motor, a body, a cushioning module and a pick-and-place module. The cushioning module is disposed in a first chamber of the body and comprises a rotary bearing which is connected to a drive shaft of the motor, and coupled to a driven shaft sleeve through a rotary follower. The rotary follower is driven by the rotary bearing to drive the driven shaft sleeve to rotate, thereby allowing the rotary bearing to displace relative to the driven shaft sleeve axially. The cushioning spring is arranged between the rotary bearing and the driven shaft sleeve. A first sealing ring and a second sealing ring of the pick-and-place module are fixed on the body to cooperatively and air-tightly seal the second chamber.

9 Claims, 4 Drawing Sheets

ROTATABLE CUSHIONING PICK-AND-PLACE DEVICE

BACKGROUND OF THE INVENTION

1. Field of the Invention

The present invention relates to a rotatable cushioning pick-and-place device, in particular to a pick-and-place device suitable for picking and placing integrated circuits or electronic components in semiconductor packaging and testing processes.

2. Description of the Related Art

In the processes for packaging or testing semiconductors, it is often necessary to transfer the objects to be tested, for example, to transfer the objects to be tested from the tray to the test socket substrate for testing. At present, the pick-and-place method of the known type normally adopts suction. Specifically, the object to be tested is sucked by means of a negative pressure for transferring to a destination. Upon reaching the destination, the negative pressure is released and the object to be tested is placed.

However, the object to be tested is a wafer or a micro-integrated circuit which is fragile, and is prone to damage. When the force of picking and placing is too large, the object to be tested may be easily damaged. Therefore, the pick-and-place device is normally equipped with a cushioning mechanism. Furthermore, the orientation of the object to be tested at the supply source and the orientation of the object to be tested placed at the destination may be sometimes different. As such, during the picking and placing process, the object to be tested may have to be orientated so as to be suitable for its placing at the next station.

Taiwan Patent Publication No. 201819099 titled "Suction Cushioning Device" discloses a conventional pick-and-place device providing the functions of cushioning and rotation. However, there are a number of defects underlying the prior art device. The cushioning mechanism and rotational drive mechanism of this known device adopt the effects of magnetic fields. In short, magnetic attractions of two ring-shaped magnets having different polarities actuate both the drive and driven shafts to rotate together, and a cushioning effect is provided between the two shafts in axial displacement.

However, the cushioning effect provided by such magnetic suction mechanism is unsatisfactory as restoring is often incomplete. Further, as multiple groups of devices are often used together on the working bench of the testing machine, after the objects to be tested are picked and placed by the groups of devices, the ends of the devices picking and placing the objects are sometimes at different height levels, and this tends to cause errors in the subsequent use. In addition, the rotation mechanism that applies magnetic suction is defective in that when the rotation is affected by foreign objects or external forces, the cooperative linking action between the drive shaft and the driven shaft may not proceed.

In addition, there are a number of cases where the suction effect to be provided by the afore-mentioned prior art device may be interrupted unexpectedly. For example, as mentioned hereinbefore, as restoring is often incomplete, once the user intends to manually pull down the rotating shaft to restore to its position, the air tight seal might be lost, thereby interrupting the suction force, and result in the dropping of the object to be tested.

On the other hand, when the rotating shaft is retracted (in the direction toward the motor), the suction force would be interrupted so that the object to be tested drops. This is caused by the fact that the sealing member adopted in the prior art device is not locked. Once the rotating shaft is axially displaced, the sealing member may be displaced easily so that an air gap is produced in between the sealing member and the body, resulting in the loss of the suction force.

SUMMARY OF THE INVENTION

The primary object of the present invention is to provide a rotatable cushioning pick-and-place device capable of cushioning the excessive impact force produced in the course of picking and placing the objects to be transferred or displaced. This invention is also capable of altering the orientations of the transferred or displaced objects under suction, so that the amount of rotation may be controlled precisely.

To achieve the above object, a rotatable cushioning pick-and-place device according to the present invention comprises: a motor having a drive shaft, a body having a first chamber adjacent to the motor, and a second chamber, a cushioning module disposed in the first chamber of the body, and a pick-and-place module. The cushioning module comprises a rotary bearing connected to the drive shaft of the motor, a driven shaft sleeve, a rotary follower, and a cushioning spring arranged between the rotary bearing and the driven shaft sleeve. The rotary bearing is coupled to the driven shaft sleeve through the rotary follower. The rotary follower is driven by the rotary bearing to drive the driven shaft sleeve to rotate, thereby allowing the rotary bearing to displace relative to the driven shaft sleeve axially. The pick-and-place module includes a pick-and-place shaft, a first sealing ring and a second seal ring securely disposed on the body. The first sealing ring and the second sealing ring are provided to cooperatively and air-tightly seal the second chamber. The pick-and-place shaft extends through the first and second sealing rings, and having one end connected to the driven shaft sleeve, and the other end has a suction hole in communication with the second chamber connected to a negative pressure source.

Accordingly, the cushioning module according to the present invention is capable of providing cushioning in the axial direction and rotation drive, while the pick-and-place module provides the functions of picking-up an object and placing the same. Specifically, the present invention makes use of a cushioning spring disposed between the rotary bearing of the cushioning module and the driven shaft sleeve to buffer the axial impact force, and can further produce a restoring effect. In addition, the rotary bearing and the driven shaft sleeve are coupled to each other through a rotary follower. As such, when the rotary bearing is driven to rotate, the driven shaft sleeve can be driven to rotate synchronously. On the other hand, in the pick-and-place module of the present invention, as the first sealing ring and the second sealing ring are securely fixed on the body, no matter how the rotation or axial movement of the pick-and-place shaft rotates or moves axially, no air gap is generated between the sealing ring and the body, and air tightness is not affected. Excellent air tightness can be maintained.

To achieve the foregoing objects, a rotatable cushioning pick-and-place device of the present invention mainly includes: a motor having a drive shaft, a body having a first chamber adjacent to the motor, and a second chamber, a cushioning module arranged in the first chamber of the body.

The cushioning module includes a rotary bearing connected to the drive shaft of the motor, a driven shaft sleeve, a rotary follower, and a cushioning spring arranged between the rotary bearing and the driven shaft sleeve. The driven shaft sleeve has an axial elongated notch. One end of the rotary follower is connected to the rotary bearing, and the other end is accommodated in the axial elongated notch, and is axially moveable in the axial elongated notch. The pick-and-place module includes a pick-and-place shaft, a first sealing ring, and a second sealing ring. The first and second sealing rings are assembled on the body and located in at least one of the first and second chambers. The pick-and-place shaft extends through the first and second sealing rings. The first and second sealing rings are provided to cooperatively and air-tightly seal the second chamber. The pick-and-place shaft includes a gas channel and a suction hole. One end of the pick-and-place shaft is connected to the driven shaft sleeve, and the suction hole is located at the other end of the pick-and-place shaft. The body is provided with a negative pressure channel having one end connected to a negative pressure source, and the other end coupled to the gas channel of the pick-and-place shaft.

As given above, the present invention has an axial elongated notch provided on the driven shaft sleeve, and a rotary follower connected to the rotary bearing at one end and accommodated in the axial elongated notch at the other end, and thus allowing the rotary bearing to move relative to the rotary follower in the axial direction. Further, a cushioning spring arranged between the rotary bearing and the driven shaft sleeve provides the effects of cushioning in the axial direction and restoring. In addition, the first sealing ring and the second sealing ring of the present invention can be assembled on the body and located in at least one of the first and second chambers, and provides airtight effect to the second chamber. As such, the pick-and-place shaft connected to the second chamber can be used to pick and place the object to be transferred.

DESCRIPTION OF THE PREFERRED EMBODIMENTS

Figure 1:
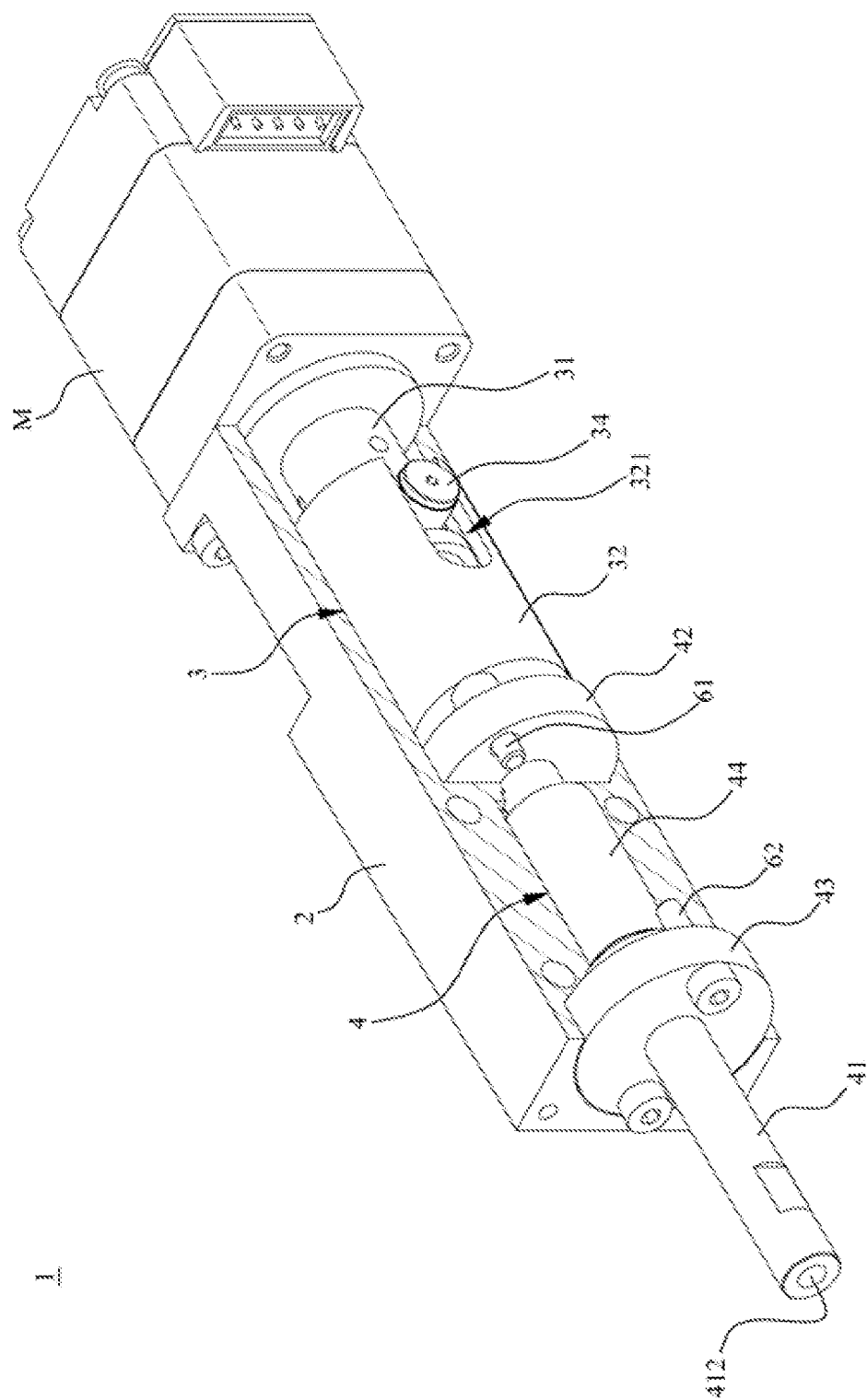
FIG. 1 is a perspective view showing a partial section of a preferred embodiment of the present invention.

The present invention is related to a rotatable cushioning pick-and-place device. In the description, similar elements will be denoted by the same reference numerals. In addition, the drawings illustrating the present invention are only schematic and not necessarily drawn to scale, and may not show all details thereof.

Figure 2:
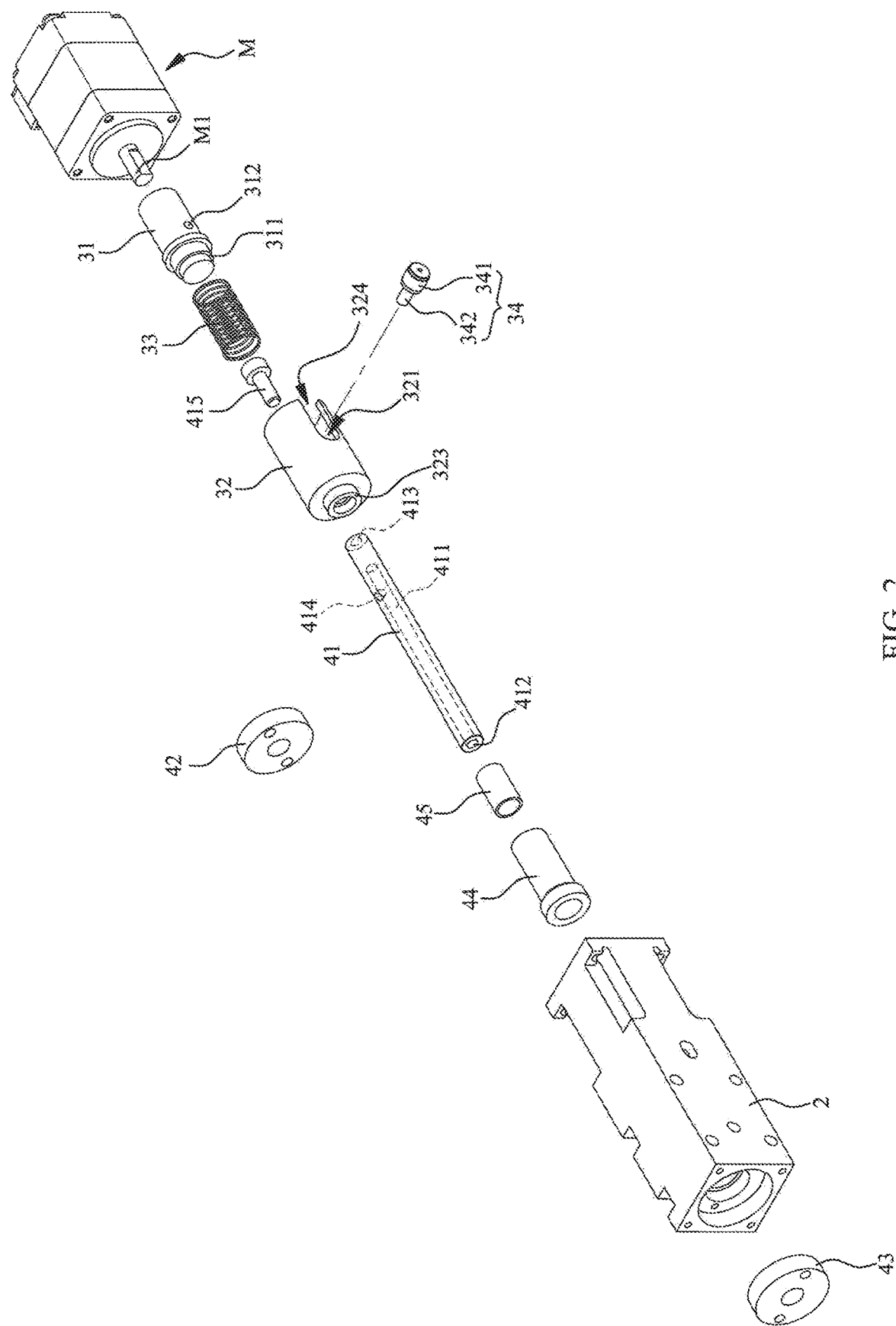
FIG. 2 is an exploded view of a preferred embodiment of the present invention.
Figure 3:
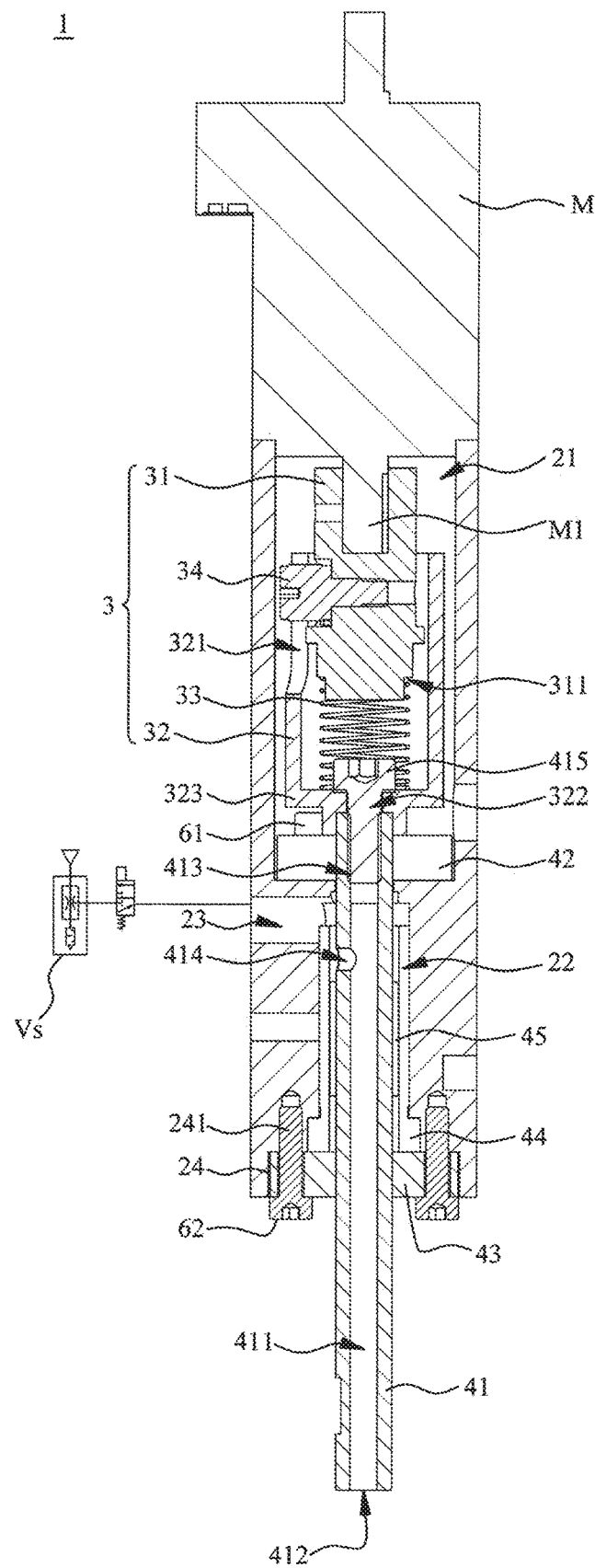
FIG. 3 is a cross-sectional view of a preferred embodiment of the present invention.

Reference is made to FIGS. 1, 2, and 3, in which FIG. 1 is a perspective view of a preferred embodiment of a rotatable cushioning pick-and-place device 1 according to the present invention, FIG. 2 is an exploded view of a preferred embodiment of the rotatable cushioning pick-and-place device 1, and FIG. 3 is a cross-sectional view of a preferred embodiment of the rotatable cushioning pick-and-place device 1 of the present invention. As shown in the figures, the rotatable cushioning pick-and-place device 1 of this embodiment primarily comprises a motor M, a body 2, a cushioning module 3, and a pick-and-place module 4. The motor M is a stepping motor having a drive shaft M1. The body 2 is a metallic casing having a first chamber 21 and a second chamber 22. The first chamber 21 is adjacent to the motor M.

The cushioning module 3 is disposed in the first chamber 21 of the body 2. The cushioning module 3 according to this embodiment mainly includes a rotary bearing 31, a driven shaft sleeve 32, a cushioning spring 33, and a rotary follower 34. The rotary bearing 31 is connected to the drive shaft M1 of the motor M, and is coupled to the driven shaft sleeve 32 through the rotary follower 34. The rotary follower 34 is driven by the rotary bearing 31 to actuate the driven shaft sleeve 32 to rotate, thereby allowing the rotary bearing 31 to displace relative to the driven shaft sleeve 32 axially. The cushioning spring 33 is provided between the rotary bearing 31 and the driven shaft sleeve 32.

Further, one end of the rotary bearing 31 is connected to the drive shaft M1 of the motor M, and the other end has a shoulder 311. The driven shaft sleeve 32 includes a bottom plate 323. One end of the cushioning spring 33 is abutted on the shoulder 311, while the other end is abutted on the bottom plate 323 of the driven shaft sleeve 32. In addition, the driven shaft sleeve 32 of this embodiment includes an axial elongated notch 321 provided with an open end 324. The rotary follower 34 includes a head portion 341 and a screw rod 342. The rotary bearing 31 includes a radial screw hole 312. The screw rod 342 of the rotary follower 34 is screwed into the radial screw hole 312, and the head portion 341 is accommodated in the axial elongated notch 321 by way of the open end 324. The diameter of the head portion 341 is equal to the width of the axial elongated notch 321.

On the other hand, the pick-and-place module 4 of this embodiment comprises a pick-and-place shaft 41, a first sealing ring 42, a second sealing ring 43, a sealing sleeve 44, and a bearing bush 45. The first sealing ring 42 is assembled on the body 2 by means of two screws 61 and is located in the first chamber 21 in proximity to the second chamber 22. Specifically, the first sealing ring 42 is located on the base of the first chamber 21. In addition, the end face of the body 2 distal to the motor M has a ring-receiving groove 24 in communication with the second chamber 22. The bottom surface of the ring-receiving groove 24 has two screw holes 241. The second sealing ring 43 is accommodated in the ring-receiving groove 24 by screwing two screws 62 into the screw holes 241.

Furthermore, the pick-and-place shaft 41 of this embodiment includes a gas channel 411, a suction hole 412, a screw hole 413, an air inlet 414, and a locking screw 415. The screw hole 413 and the suction holes 412 are respectively provided at the two opposite ends of the pick-and-place shaft 41. The suction hole 412 is in communication with the air inlet 414 through the gas channel 411, and the air inlet 414 is in communication with the second chamber 22. In addition, the bottom plate 323 of the driven shaft sleeve 32 is provided with a through hole 322 through which the locking screw 415 is screwed into the screw hole 413 of the pick-and-place shaft 41, so as to connect the pick-and-place shaft 41 to the driven shaft sleeve 32. Moreover, the pick-and-place shaft 41 extends through the first and second seal rings 42, 43, so the second chamber 22 is air-tightly sealed by the first seal ring 42 and the second seal ring 43.

In addition, the body 2 is provided with a negative pressure channel 23 having one end connected to a negative pressure source Vs, and the other end connected to the second chamber 22. A negative pressure is supplied to the second chamber 22 from the negative pressure source Vs, so that a negative pressure is generated synchronously in the gas channel 411 and the suction hole 412 of the pick-and-place shaft 41. As such, the object to be transferred can be picked. In addition, in this embodiment, the sealing sleeve 44 is disposed in the second chamber 22, and the bearing bush 45, which is a ball sleeve, is located between the sealing sleeve 44 and the pick-and-place shaft 41, so that the pick-and-place shaft 41 can be freely rotated and moved in an axial direction.

In the case of the axial displacement, the driven shaft sleeve 32 is guided by the axial elongated notch 321 and the rotary driving member 34 to move axially relative to the rotary bearing 31, and the cushioning spring 33 arranged between the driven shaft sleeve 32 and the rotary bearing 31 is capable of absorbing the impact force transmitted to the driven shaft sleeve 32 from the pick-and-place shaft 41 and of biasing the driven shaft sleeve 32 to its home position. Furthermore, in the case that there is a need to rotate the pick-and-place shaft 41, the drive shaft M1 of the motor M drives the rotary bearing 31 to rotate so as to actuate the rotary driving member 34 to push the axial elongated notch 321 of the driven shaft sleeve 32. As such, the driven shaft sleeve 32 may rotate synchronously with the rotary bearing 31, so that the pick-and-place shaft 41 connected to the driven shaft sleeve 32 can be rotated.

Figure 4:
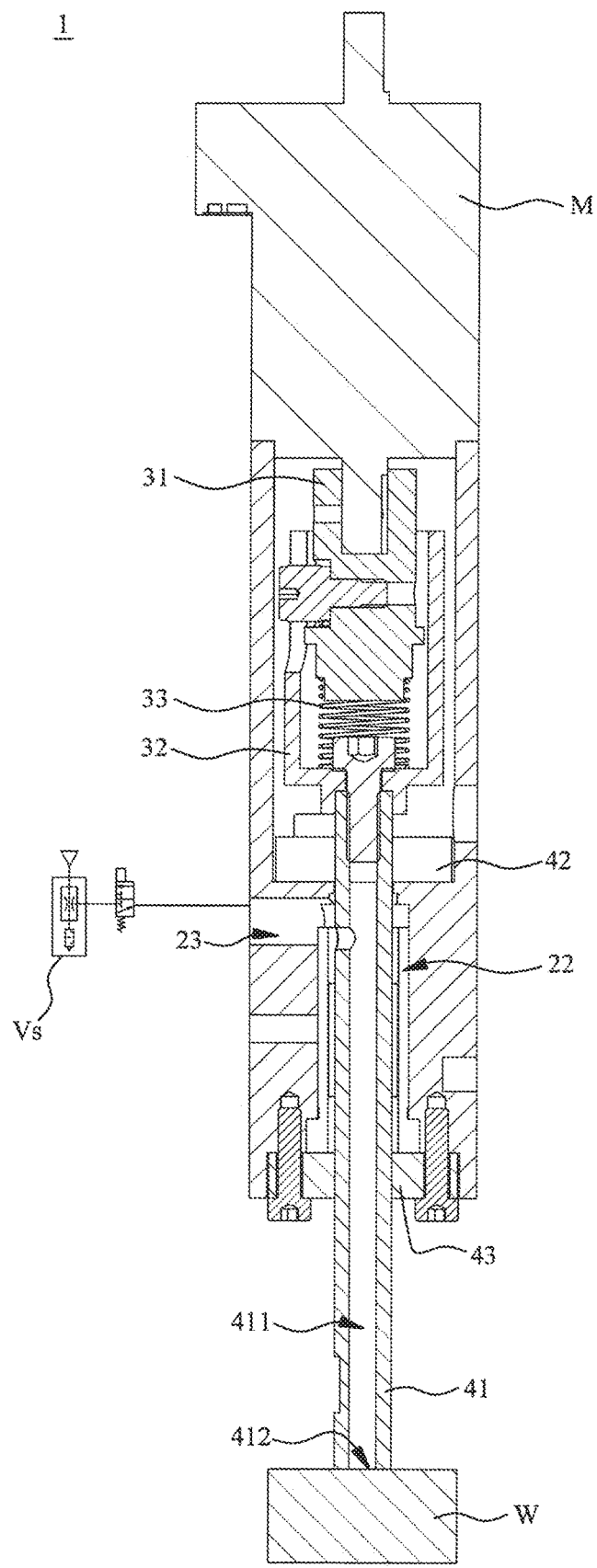
FIG. 4 is a cross-sectional view of a preferred embodiment of the present invention, showing that the invention is subjected to an impact when picking or placing a transferred object.

Reference is made to FIG. 4 which is a cross-sectional view of a preferred embodiment of the present invention showing that the invention is subjected to an impact force when picking or placing an object to be transferred. As shown in FIG. 4, when it is intended to pick up an object to be transferred W, a lifting arm (not shown) operates to descend the rotatable cushioning pick-and-place device 1 to contact the upper surface of the object W. At this instant, the pneumatic solenoid valve disposed externally of the negative pressure channel 23 is actuated to connect the negative pressure source Vs to the second chamber 22, so that the second chamber 22 generates a negative pressure. Accordingly, a negative pressure is also generated synchronously in the gas channel 411 and the suction hole 412, and the object W can be picked.

However, when the rotatable cushioning pick-and-place device 1 descends to contact the object to be transferred W, the extent of descend may be too great in some instances that the pick-and-place device 1 may collide with the object W. At this instant, the cushioning spring 33 may buffer the impact force resulted by the collision. As shown in FIG. 4, the cushioning spring 33 is compressed when subjected to the impact force, and the pick-and-place shaft 41 and the driven shaft sleeve 32 are retracted in the axial direction toward the motor M, while the drive shaft M1 of the motor M and the rotary bearing 31 remain stationary. Moreover, as the first and second sealing rings 42, 43 are directly fixed on the body 2, the airtightness is not affected no matter how the pick-and-place shaft 41 rotates or axially moves. As such, the pick-and-place shaft 41 can constantly pick and hold the object W to be transferred.

The preferred embodiments of the present invention are illustrative only, and the invention is not limited to the details disclosed in the drawings and the specification. Accordingly, it is intended that the invention is not limited to the disclosed embodiments, but that it has the full scope permitted by the language of the following claims.

What is claimed is:

1. A rotatable cushioning pick-and-place device, comprising:
    a motor having a drive shaft;
    a body having a first chamber adjacent to the motor, and a second chamber;
    a cushioning module disposed in the first chamber of the body, the cushioning module comprising a rotary bearing connected to the drive shaft of the motor, a driven shaft sleeve, a rotary follower, and a cushioning spring disposed between the rotary bearing and the driven shaft sleeve; the rotary bearing being coupled to the driven shaft sleeve through the rotary follower, and the rotary follower being driven by the rotary bearing to drive the driven shaft sleeve to rotate, thereby allowing the rotary bearing to displace relative to the driven shaft sleeve axially; and
    a pick-and-place module comprising a pick-and-place shaft, a first sealing ring, a second sealing ring, a sealing sleeve and a bearing bush, the a first sealing ring and the second sealing ring securely disposed on the body to cooperatively and air-tightly seal the second chamber; the pick-and-place shaft extending through the first and second sealing rings and having one end connected to the driven shaft sleeve and the other end provided with a suction hole in communication with the second chamber which is connected to a negative pressure source; the sealing sleeve arranged in the second chamber, the bearing bush arranged between the sealing sleeve and the pick-and-place shaft.

2. The rotatable cushioning pick-and-place device according to claim 1, wherein the pick-and-place shaft includes a gas channel, the body includes a negative pressure channel having one end connected to the negative pressure source and the other end coupled to the gas channel of the pick-and-place shaft.

3. The rotatable cushioning pick-and-place device according to claim 2, wherein the pick-and-place shaft further includes a screw hole, an air inlet and a locking screw, the driven shaft sleeve includes a through hole through which the locking screw is screwed into the screw hole of the pick-and-place shaft; and the gas channel is in communication with the second chamber through the air inlet.

4. The rotatable cushioning pick-and-place device according to claim 3, wherein the rotary bearing has one end connected to the drive shaft of the motor and the other end provided with a shoulder, the driven shaft sleeve comprises a bottom plate on which the through hole is provided; one end of the cushioning spring is abutted on the shoulder, and the other end of the cushioning spring is abutted on the bottom plate of the driven shaft sleeve.

5. The rotatable cushioning pick-and-place device according to claim 1, wherein the first sealing ring is disposed in the first chamber in proximity to the second chamber by means of at least one screw; and the second sealing ring is disposed in the second chamber distal to the first chamber by means of at least one screw.

6. The rotatable cushioning pick-and-place device according to claim 5, wherein an end face of the body distal to the motor has a ring-receiving groove in communication with the second chamber, the ring-receiving groove includes a bottom surface having at least one screw hole, the second sealing ring is accommodated and secured in the ring-receiving groove by screwing the at least one screw into the at least one screw hole.

7. The rotatable cushioning pick-and-place device according to claim 1, wherein the driven shaft sleeve is provided with an axial elongated notch, the rotary follower has one end connected to the rotary bearing and the other end received in the axial elongated notch, and is axially moveable in the axial elongated notch.

8. The rotatable cushioning pick-and-place device according to claim 7, wherein the rotary follower comprises a head portion and a screw rod, the axial elongated notch of the driven shaft sleeve has an open end, the rotary bearing has a radial screw hole, the screw rod of the rotary follower is screwed into the radial screw hole, the head portion is received in the axial elongated notch through the open end, and the head portion has a diameter equal to a width of the axial elongated notch.

9. A rotatable cushioning pick-and-place device, comprising:
  a motor having a drive shaft;
  a body having a first chamber adjacent to the motor, and a second chamber;
  a cushioning module disposed in the first chamber of the body, the cushioning module comprising a rotary bearing connected to the drive shaft of the motor, a driven shaft sleeve, a rotary follower, and a cushioning spring disposed between the rotary bearing and the driven shaft sleeve; the driven shaft sleeve being provided with an axial elongated notch, the rotary follower having one end connected to the rotary bearing and the other end received in the axial elongated notch and axially moveable in the axial elongated notch; and
  a pick-and-place module comprising a pick-and-place shaft, a first sealing ring and a second sealing ring, the first and second searing rings being disposed on the body and located in at least one of the first and second chambers, the pick-and-place shaft extending through the first and second sealing rings, and the first and second sealing rings being provided to cooperatively and air-tightly seal the second chamber, the pick-and-place shaft including a gas channel and a suction hole, the pick-and-place shaft having one end connected to the driven shaft sleeve, and the suction hole being located at the other end of the pick-and-place shaft; the body being provided with a negative pressure channel having one end connected to a negative pressure source and the other end coupled to the gas channel of the pick-and-place shaft.

\* \* \* \* \*